United States Patent [19]

Bhaskar et al.

[11] Patent Number: 4,844,945
[45] Date of Patent: Jul. 4, 1989

[54] PROCESS FOR PRODUCING PATTERNS IN DIELECTRIC LAYERS FORMED BY PLASMA ENHANCED CHEMICAL VAPOR DEPOSITION (PECVD)

[75] Inventors: Eldurkar V. Bhaskar; Marzio A. Leban, both of Corvallis; Michael D. Angerstein, McMinnville, all of Oreg.

[73] Assignee: Hewlett-Packard Company, Palo Alto, Calif.

[21] Appl. No.: 195,236

[22] Filed: May 18, 1988

[51] Int. Cl.⁴ ............................................. B05D 3/06
[52] U.S. Cl. ...................................... 427/39; 427/38; 427/43.1
[58] Field of Search .................. 427/33, 39, 40, 43.1, 427/41; 156/643

[56] References Cited

U.S. PATENT DOCUMENTS 4,550,257 10/1985 Binnig et al. .......................... 427/38

OTHER PUBLICATIONS

Bunshah et al., *Deposition Technologies for Films & Coatings,* (Noyes, Park Ridge, NJ.)/. 1982, pp. 365–384.

*Primary Examiner*—Norman Morganstern
*Assistant Examiner*—Margaret Bucker
*Attorney, Agent, or Firm*—William J. Bethurum; Leslie G. Murray

[57] ABSTRACT

A process for forming a dielectric patterned layer of any desired geometry on a selected substrate which includes vapor depositing selected reactants on said substrate only in areas thereon which are coextensive with the surface area of an adjacent metal electrode pattern.

4 Claims, 4 Drawing Sheets

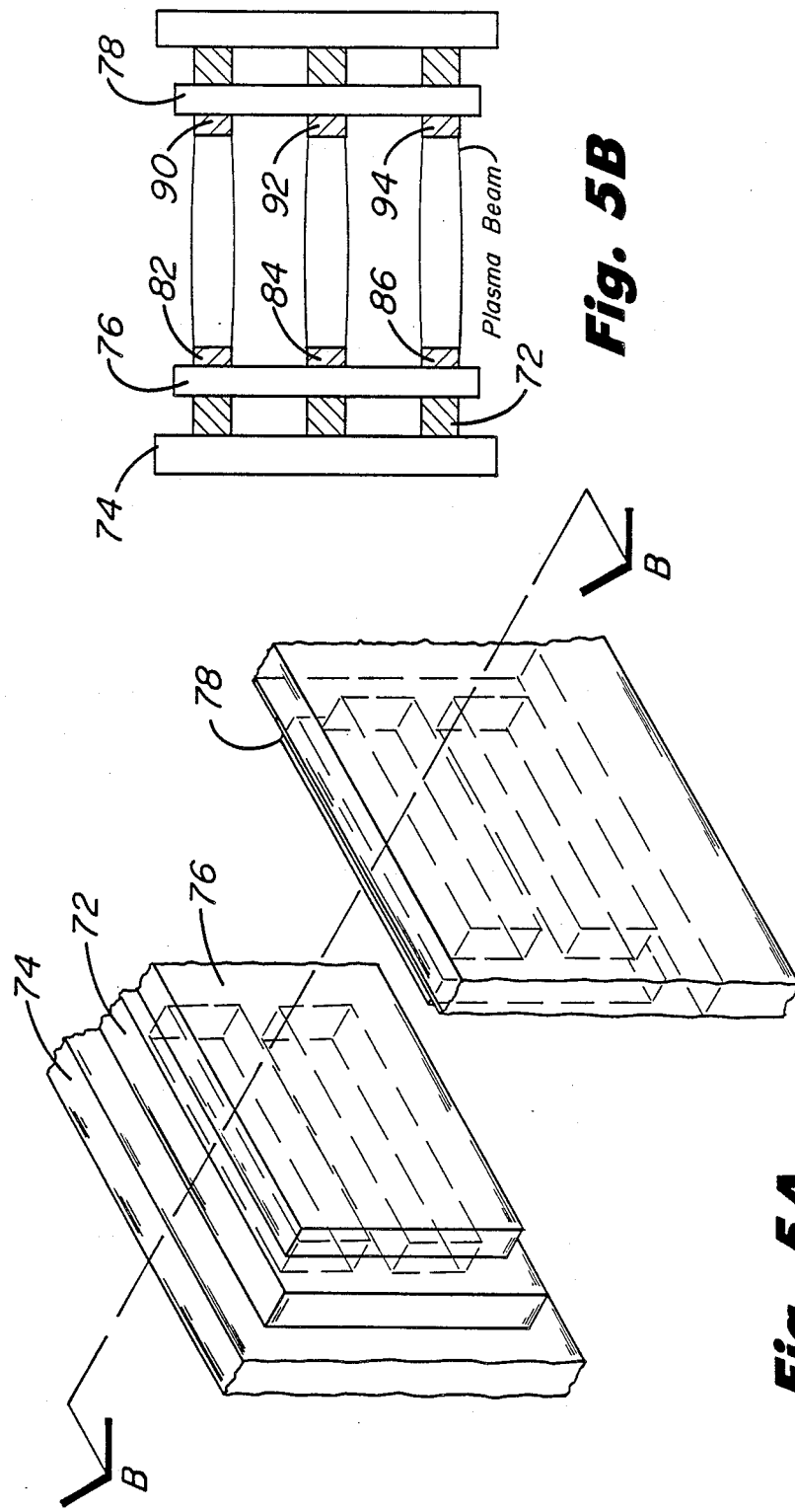

PROCESS FOR PRODUCING PATTERNS IN DIELECTRIC LAYERS FORMED BY PLASMA ENHANCED CHEMICAL VAPOR DEPOSITION (PECVD)

TECHNICAL FIELD

This invention relates generally to the plasma enhanced chemical vapor deposition (PECVD) of insulating materials on selected substrates and more particularly to such processes for forming thin patterned dielectric layers which are PECVD deposited on the substrates.

BACKGROUND ART

In the semiconductor art of plasma enhanced chemical vapor deposition, it is known to provide a PECVD reactor for depositing dielectric materials such as silicon dioxide, silicon nitride, silicon carbide, and the like, and such a reactor will typically include a quartz tube which is maintained at a pressure of about 1 Torr or greater. The reactive gasses such as silane, oxygen, nitrous oxide, ammonia and methane which are frequently used in this process are introduced into the quartz tube which is typically maintained at a temperature in the range of between 200° C. and 400° C. The substrates that are to be deposited with a dielectric material are placed on electrodes which are typically made of graphite or aluminum, and R.F. power is applied to these electrodes to thereby create an R.F. plasma between the electrodes. This plasma dissociates and excites the reactive species within the reactor, and these reactor species in turn react with each other and thereby deposit a continuous layer of an insulating material on the substrate.

In order to then form a desired pattern in the thus deposited dielectric layer, it becomes necessary to employ some type of selective etching process to remove certain regions of the dielectric layer, as is well known. For example, conventional photolithographic masking, ultraviolet exposure and etching processes may be first used to form a photoresist mask on the dielectric layer, and then a selective etchant such as dilute hydrofluoric acid or a reactive plasma may then be used to remove the unprotected areas of the photoresist-masked dielectric layer to thereby form the desired pattern of openings therein.

DISCLOSURE OF INVENTION

The general purpose of the present invention is to eliminate the need for the above described masking and selective etching process in order to provide and form the desired pattern of openings in the plasma deposited dielectric layer, thereby greatly reducing the cost and complexity of the dielectric pattern forming process. To accomplish this purpose, we have discovered and developed a novel plasma enhanced chemical vapor deposition process for forming these dielectric patterns on selected substrates. This process includes initially providing a patterned metal electrode adjacent to one surface of a chosen substrate. Selected reactive gasses are provided in the vicinity of the patterned metal electrode and under conditions of predetermined elevated temperature and controlled pressure. Then, RF power is applied to the patterned metal electrode so as to dissociate and excite certain reactive species within these gasses and cause the species to react with one another and thereby selectively deposit only on the area of the chosen substrate which is coextensive with the adjacent metal in the patterned metal electrode. Thus, when the substrate is removed from the patterned metal electrode, it will have the desired dielectric pattern on one surface thereof without the further need of any selective masking and etching processes.

The above briefly summarized invention and its attendant advantages and novel features will become better understood and appreciated in the following description of the accompanying drawings.

BRIEF DESCRIPTION OF THE DRAWINGS

FIG. 5A is an expanded view showing two facing substrates when mounted on the metal electrode pattern configuration of FIG. 4 and prior to forming the PECVD interior insulating pattern in FIG. 5B.

FIG. 5B is a cross section view taken along lines B—B of FIG. 5A after the PECVD insulating pattern is formed.

DETAILED DESCRIPTION OF THE DRAWINGS

Figure 1:
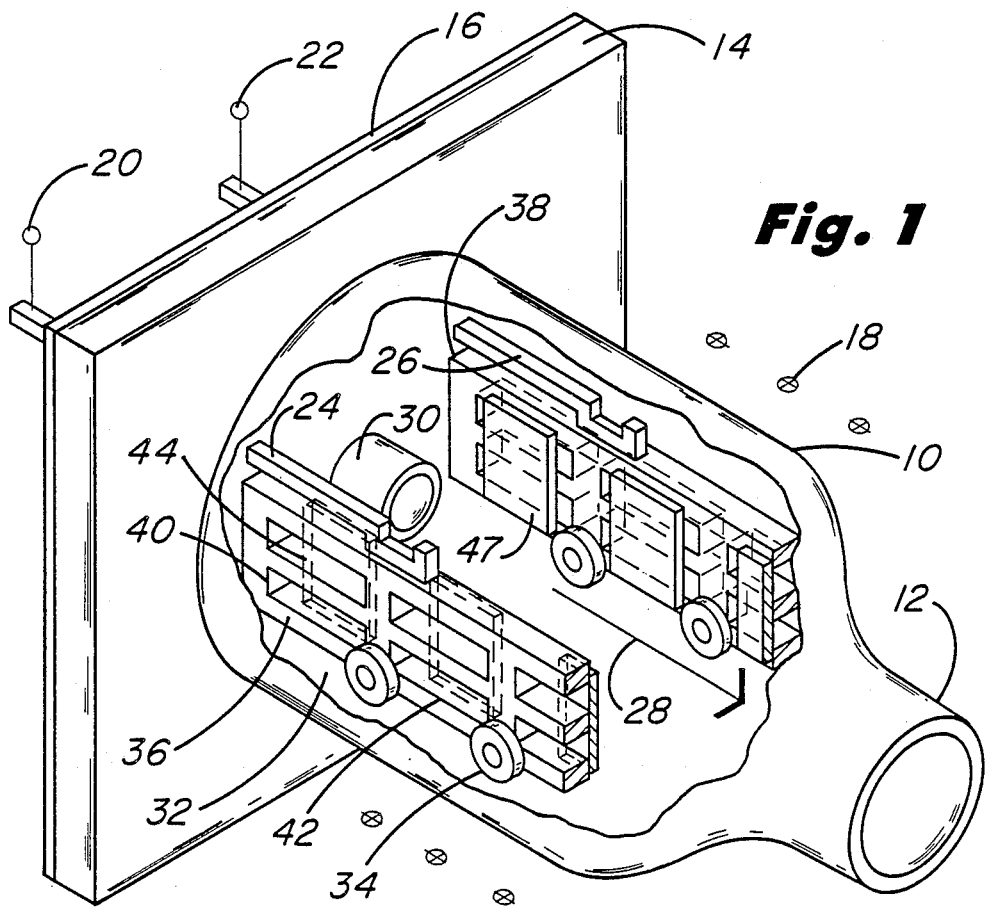
FIG. 1 is a partially cut-away isometric view of the PECVD reactor which is used in carrying out preferred process embodiments of the invention.

Referring now to FIG. 1, there is shown a plasma enhanced chemical vapor deposition (PECVD) reactor including a quartz tube 10 which is connected by way of exhaust tube 12 to a vacuum pump (not shown). The quartz tube 10 is integrally joined to a vertical end wall 14, and the end wall 14 is in turn adapted to receive a cover plate 16 for sealing off the tube 10 during a PECVD operation. Resistive heater elements 18 are positioned as shown adjacent to the tube 10 in order to heat the tube to a desired elevated temperature. RF power is made available inside the tube 10 as indicated by way of electrodes 20 and 22 which extend as shown through the end cover plate 16 and through the end wall 14. These RF electrodes 20 and 22 are electrically connected to spring biased end connectors 24 and 26 which extend into the quartz tube 10 and on opposite sides of the path 28 of reactant gas flow emanating from the gas input tube 30.

The patterned electrodes 36 and 38 can be rolled in and out of the reactor tube 10 on the rollers 34 affixed to the same. Each of the metal electrodes 36 and 38 include, for example only, a plurality of openings 40 and 42 (shown in the figure as rectangular, but may be any desired geometrical shape). The openings 40 and 42 correspond to the desired openings in a dielectric pattern to be formed in the manner described below. These rectangular openings 40 and 42 are covered by a substrate 44 (indicated by the dotted line) upon which it is desired to form a patterned dielectric layer with openings therein corresponding to and coextensive with the openings 40 and 42 in the metal electrode 36.

In operation, when the reactive gasses pass through the inlet tube 30 and are flowed through the quartz reactor 10 and through the exhaust exit line 12 during a PECVD deposition, certain elements of the reactive gasses will be directionally drawn only to the surface areas of the substrate 44 which are coextensive with the areas of metal in the metal electrodes 36 and 38. That is, no plasma enhanced chemical vapor deposition will occur in the electrode openings 40 and 42.

Figure 2:
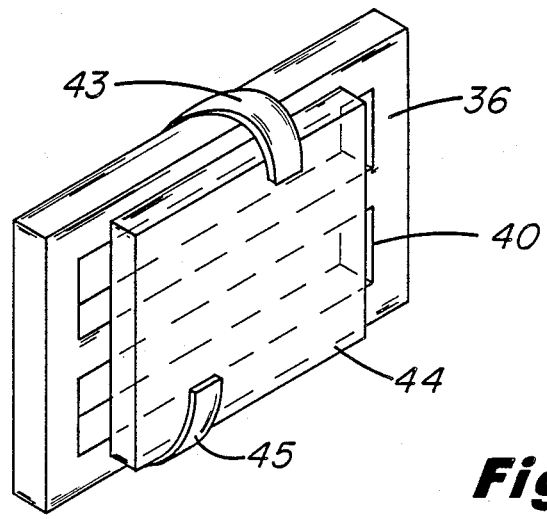
FIG. 2 is an enlarged fragmented view to illustrate one way for securing a substrate to a PECVD boat electrode.

Referring now to FIG. 2, there is shown one suitable clip-on arrangement which may be used for securing the substrates 44 to the metal electrodes 36. A pair of spring loaded clips 43 and 45 are secured to the back side of an electrode 36 and will hold a substrate 44 temporarily in place during a PECVD operation.

Figures 3A, 3B:
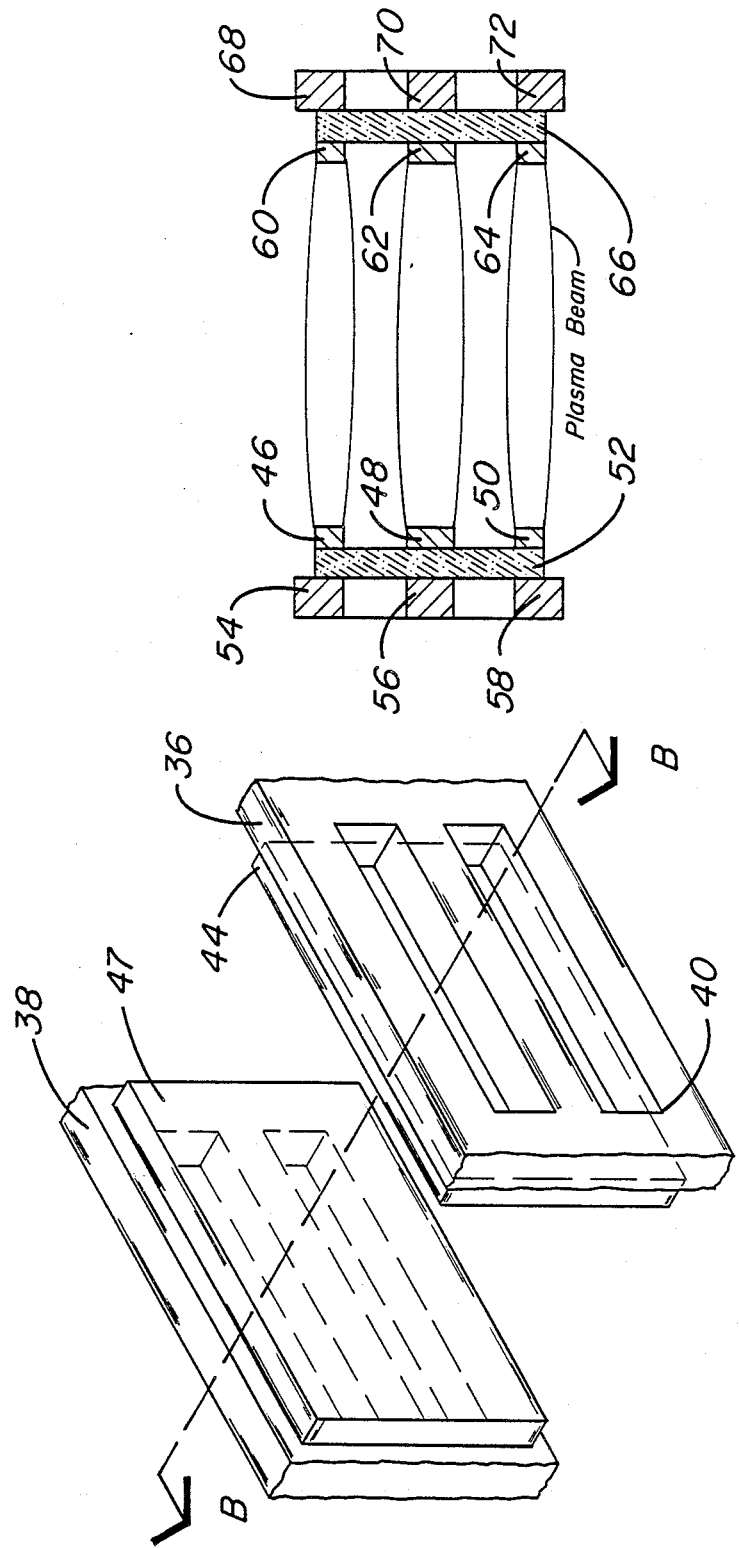
FIG. 3A is an expanded view showing two facing substrates mounted in the configuration shown in FIG. 1 and prior to the formation of the PECVD pattern shown in FIG. 3B.
FIG. 3B is a cross section view taken along lines B—B of FIG. 3A after the PECVD insulating pattern has been found.

Referring now to FIGS. 3A and 3B, the cross section view in FIG. 3B is taken along lines B-B of FIG. 3A after the PECVD deposition has taken place and shows three focused deposition areas within which a dielectric pattern indicated as 46,48 and 50 is deposited on the left hand substrate 52. These areas correspond to sections of the metal regions 54,56 and 58 in the left hand metal electrode which are coextensive with the substrate 52. Similarly, a dielectric pattern defined by regions 60,62 and 64 is deposited on the right hand substrate 66 which is positioned as shown on the right hand metal electrode, including metal regions 68,70 and 72 therein.

Figure 4:
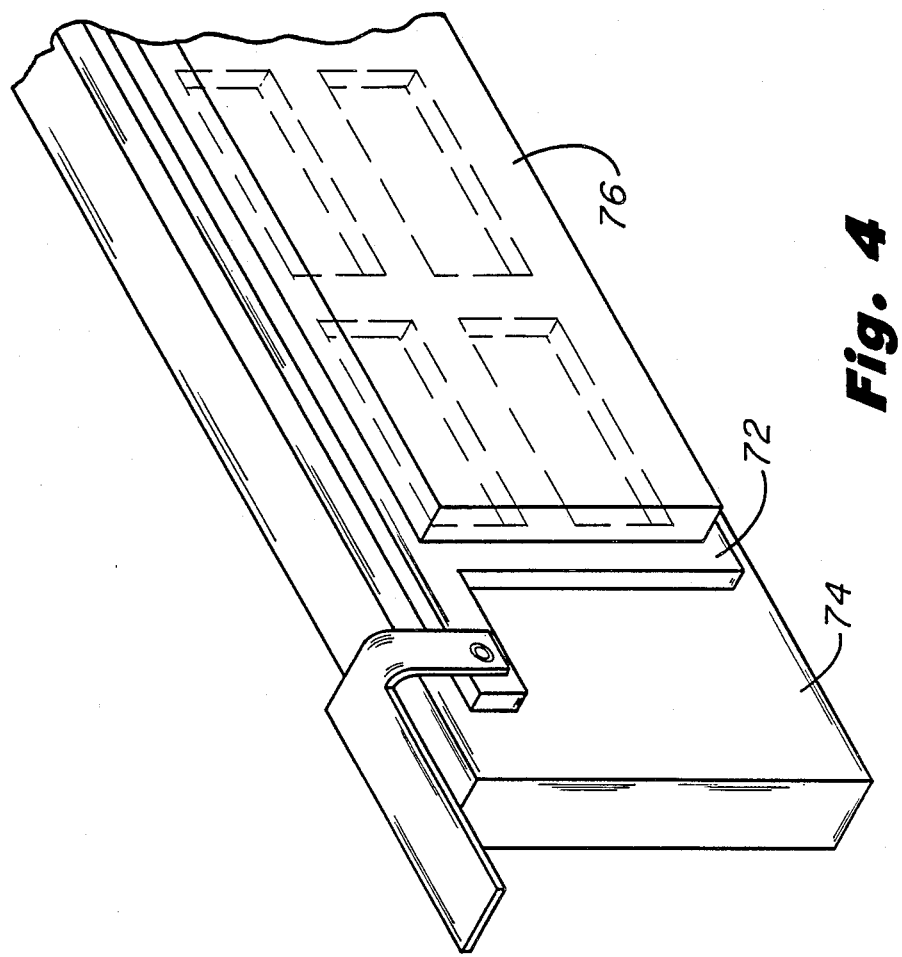
FIG. 4 shows a different type of electrode mounting arrangement than that shown in FIG. 1, and includes a ceramic or other type support substrate to which the metal electrode pattern is affixed.

Referring now to FIGS. 4,5A and 5B, the main difference in the embodiment illustrated in these three figures and the embodiment illustrated in FIGS. 3A and 3B above is that the metal electrode pattern 72 in FIG. 4 is affixed to an underlying support member 74, such as a ceramic substrate. The substrate 74 has the property of being an excellent electrical insulator and is capable of withstanding elevated temperatures in the plasma enhanced PECVD reactor. Another difference between these latter two embodiments is that the elongated deposition substrates 76 and 78 shown in FIG. 5A cover the entire series of openings in the underlying metal electrodes 72. Apart from these two distinctions, the PECVD deposition operation is the same as the deposition operation described above with reference FIGS. 3A and 3B and provides for the dielectric plasma enhanced chemical vapor deposition of a pattern 82,84 and 86 on the left hand substrate 76 and the pattern 90,92 and 94 on the right hand substrate 78 as indicated in FIG. 5B.

Various modifications may be made in the above described embodiments without departing from the scope of this invention. For example, the substrates to be deposited may be mounted on a support member having no electrodes thereon and then patterned on one surface thereon using a removable electrode pattern temporarily laid over the support member surface and connected to source of RF power. In addition, the patterned insulating layers may be formed in any desired geometry in accordance with the chosen geometries of the metal electrode patterns.

EXAMPLE

The following example provides certain reactant gasses, gas flow rates, temperature and pressure which will be suitable for the deposition of one particular type of dielectric pattern on a silicon substrate:

| Dielectric Film | Reactant Gasses | Temperature | Pressure |
| --- | --- | --- | --- |
| Silicon Nitride | Silane-250 standard cubic centimeters per minute (sccm) Amnionia-2000 sccm | 350° C. | 0.7 Torr |
| Silicon Oxy Nitride | Silane-250 sccm Nitrous Oxide-2000 sccm | 350° C. | 1.0 Torr |

We claim:
1. A process for forming patterned insulating layers of a desired geometry on selected substrates which includes steps of:
   a. providing a patterned metal electrode adjacent to one surface of a chosen substrate,
   b. providing selected reactive gasses in the vicinity of said metal electrode and under controlled conditions of predetermined elevated temperature and pressure, and
   c. applying RF power to said electrode to dissociate and excite certain reactive species within said gasses and cause said species to react with one another and thereby deposit only on the area of said surface of said chosen substrate which is coextensive with one surface pattern of the metal in said patterned metal electrode.

2. A process for forming a dielectric patterned layer of a desired geometry on a selected substrate which includes exciting selected gas reactants with an RF field and vapor depositing certain ones of said selected reactants on said substrate only in areas thereon which are coextensive with a surface area of an adjacent metal electrode pattern.

3. The process defined in claim 2 wherein said vapor depositing is carried out using plasma enhanced chemical vapor deposition.

4. The process defined in claim 3 wherein said vapor deposition includes:
   a. providing selected reactive gasses in the vicinity of said metal electrode and under controlled conditions of predetermined elevated temperature and pressure, and
   b. applying RF power to said electrode to dissociate and excite certain reactive species within said gasses and cause said species to react with one another and thereby deposit only on the area of said surface of said chosen substrate which is coextensive with one surface pattern of the metal in said patterned metal electrode.

* * * * *